US012520462B2

United States Patent
Borisov et al.

(10) Patent No.: US 12,520,462 B2
(45) Date of Patent: Jan. 6, 2026

(54) REFRIGERANT COOLED HEAT SINK FOR POWER ELECTRONIC MODULES

(71) Applicant: Carrier Corporation, Palm Beach Gardens, FL (US)

(72) Inventors: Konstantin Borisov, Avon, CT (US); Lokanath Mohanta, Liverpool, NY (US); Arindom Joardar, Jamesville, NY (US); Ismail Agirman, Southington, CT (US)

(73) Assignee: CARRIER CORPORATION, Palm Beach Gardens, FL (US)

( * ) Notice: Subject to any disclaimer, the term of this patent is extended or adjusted under 35 U.S.C. 154(b) by 544 days.

(21) Appl. No.: 17/978,657

(22) Filed: Nov. 1, 2022

(65) Prior Publication Data

US 2023/0138320 A1    May 4, 2023

Related U.S. Application Data

(60) Provisional application No. 63/274,729, filed on Nov. 2, 2021.

(51) Int. Cl.
| | |
|---|---|
| *G06F 1/16* | (2006.01) |
| *H05K 5/00* | (2025.01) |
| *H05K 7/00* | (2006.01) |
| *H05K 7/20* | (2006.01) |

(52) U.S. Cl.
CPC ..... *H05K 7/20936* (2013.01); *H05K 7/20327* (2013.01); *H05K 7/20518* (2013.01)

(58) Field of Classification Search
CPC .......... H05K 7/20936; H05K 7/20327; H05K 7/20518
See application file for complete search history.

(56) References Cited

U.S. PATENT DOCUMENTS

| | | | | |
|---|---|---|---|---|
| 5,471,850 | A  * | 12/1995 | Cowans | F25B 1/10 |
| | | | | 62/223 |
| 8,922,998 | B2 * | 12/2014 | Campbell | H05K 7/2079 |
| | | | | 361/689 |
| 8,947,873 | B2 * | 2/2015 | Campbell | H05K 7/20336 |
| | | | | 361/679.52 |
| 9,210,831 | B2 * | 12/2015 | Arvelo | H01L 23/473 |
| 9,332,673 | B2 * | 5/2016 | Boday | F28D 15/02 |
| 9,357,675 | B2 * | 5/2016 | Campbell | B23P 15/26 |
| 9,437,523 | B2 * | 9/2016 | Joshi | H01L 23/4735 |

(Continued)

FOREIGN PATENT DOCUMENTS

DE    102015212720 A1    1/2017

OTHER PUBLICATIONS

Extended European Search Report; European Application No. 22205164.1; dated Mar. 27, 2023; 6 pages.

*Primary Examiner* — Anthony M Haughton
(74) *Attorney, Agent, or Firm* — CANTOR COLBURN LLP

(57) ABSTRACT

A heat exchanger assembly includes a housing having at least one area of heat flux and a fluid circuit arranged within an interior of the housing. The fluid circuit having an inlet manifold, an outlet manifold, and at least one fluid passage connecting the inlet manifold and the outlet manifold. The at least one fluid passage is positioned relative to the housing to perform localized cooling of the housing at the at least one area of heat flux. A cooling medium circulates through the fluid circuit.

18 Claims, 4 Drawing Sheets

(56) References Cited

U.S. PATENT DOCUMENTS

| | | | | |
|---|---|---|---|---|
| 9,445,526 B2* | 9/2016 | Zhou | ............... | H01L 23/4735 |
| 9,622,380 B1* | 4/2017 | Joshi | ............... | H05K 7/20327 |
| 9,638,477 B1* | 5/2017 | Choi | ............... | H01L 23/46 |
| 11,589,482 B2* | 2/2023 | Gao | ............... | H05K 7/20781 |
| 12,063,760 B2* | 8/2024 | Nguyen | ............... | H05K 7/20645 |
| 2017/0055378 A1* | 2/2017 | Zhou | ............... | H05K 7/20927 |

* cited by examiner

REFRIGERANT COOLED HEAT SINK FOR POWER ELECTRONIC MODULES

CROSS-REFERENCE TO RELATED APPLICATIONS

This application claims the benefit of U.S. provisional patent application Ser. No. 63/274,729, filed Nov. 2, 2021, the entire contents of which are incorporated herein by reference.

BACKGROUND

Exemplary embodiments pertain to the art of heat exchangers, and more particularly, the present disclosure relates to an interface for cooling power electronics that are mounted to a heat exchanger.

Power electronic devices such as motor drives can generate waste heat during operation based on the efficiency of the device. Additionally, when the power electronic devices heat up, their efficiency can degrade adding to the amount of heat they generate. When configured into a refrigeration system, effective thermal integration of these devices can be important aspect to the system's overall efficiency and reliability. Consequently, a goal of the system integrator is to maintain these components within a range of operating temperatures which will maximize the system efficiency. Accordingly, there remains a need in the art for heat exchangers configured to closely integrate with power electronic devices which can maintain optimal temperatures for these components under a variety of load conditions.

BRIEF DESCRIPTION

According to an embodiment, a heat exchanger assembly includes a housing having at least one area of heat flux and a fluid circuit arranged within an interior of the housing. The fluid circuit having an inlet manifold, an outlet manifold, and at least one fluid passage connecting the inlet manifold and the outlet manifold. The at least one fluid passage is positioned relative to the housing to perform localized cooling of the housing at the at least one area of heat flux. A cooling medium circulates through the fluid circuit.

In addition to one or more of the features described herein, or as an alternative, further embodiments comprising at least one power electronics module mounted to the housing, the at least one area of heat flux being formed at the at least one power electronics module.

In addition to one or more of the features described herein, or as an alternative, further embodiments the at least one power electronics module is mounted in a vertical plane.

In addition to one or more of the features described herein, or as an alternative, further embodiments the at least one fluid passage is axially aligned with the at least one power electronics module relative to the housing.

In addition to one or more of the features described herein, or as an alternative, further embodiments the at least one power electronics module is in an overlapping relationship with the at least one fluid passage.

In addition to one or more of the features described herein, or as an alternative, further embodiments at least one of a size and shape of the at least one fluid passage is complementary to the at least one power electronics module.

In addition to one or more of the features described herein, or as an alternative, further embodiments the at least one fluid passage includes a single channel.

In addition to one or more of the features described herein, or as an alternative, further embodiments the at least one fluid passage includes a plurality of channels, the plurality of channels being arranged in parallel.

In addition to one or more of the features described herein, or as an alternative, further embodiments the plurality of channels are formed as a plurality of recesses in the housing.

In addition to one or more of the features described herein, or as an alternative, further embodiments the at least one fluid passage comprises: a single recess formed in the housing; and a divider arranged within the single recess, the divider forming the plurality of channels within the single recess.

In addition to one or more of the features described herein, or as an alternative, further embodiments the plurality of channels are coupled to the inlet manifold via an inlet interface and the plurality of channels are coupled to the outlet manifold via an outlet interface.

In addition to one or more of the features described herein, or as an alternative, further embodiments the at least one power electronics module includes a plurality of power electronics modules and the at least one area of heat flux includes a plurality of areas of heat flux, each of the plurality of areas of heat flux being formed at a respective power electronic module of the plurality of power electronics modules.

In addition to one or more of the features described herein, or as an alternative, further embodiments the at least one fluid passage further comprises a plurality of fluid passages and the inlet manifold is configured such that the cooling medium is equally distributed to each of the plurality of fluid passages.

In addition to one or more of the features described herein, or as an alternative, further embodiments a hydraulic diameter of the inlet manifold varies over a length of the inlet manifold.

In addition to one or more of the features described herein, or as an alternative, further embodiments comprising a distributor arranged within the inlet manifold.

In addition to one or more of the features described herein, or as an alternative, further embodiments the plurality of fluid passages is connected to the inlet manifold via a plurality of inlet interfaces, and a hydraulic diameter of a connection between each of the plurality of inlet interfaces and the inlet manifold varies over a length of the inlet manifold.

In addition to one or more of the features described herein, or as an alternative, further embodiments a pressure drop across the plurality of fluid passages is at least five times greater than a pressure drop within the inlet manifold.

In addition to one or more of the features described herein, or as an alternative, further embodiments the fluid circuit further comprises a fluid inlet operably coupled to the inlet manifold and a fluid outlet operably coupled to the outlet manifold, the fluid inlet being disposed below the fluid outlet such that during operation a flow direction of the cooling medium through the inlet manifold and the outlet manifold opposes gravity.

In addition to one or more of the features described herein, or as an alternative, further embodiments the housing further comprises a first housing portion and a second housing portion joined along corresponding mating surfaces.

In addition to one or more of the features described herein, or as an alternative, further embodiments at least one of the first housing portion and the second housing portion is a plate.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
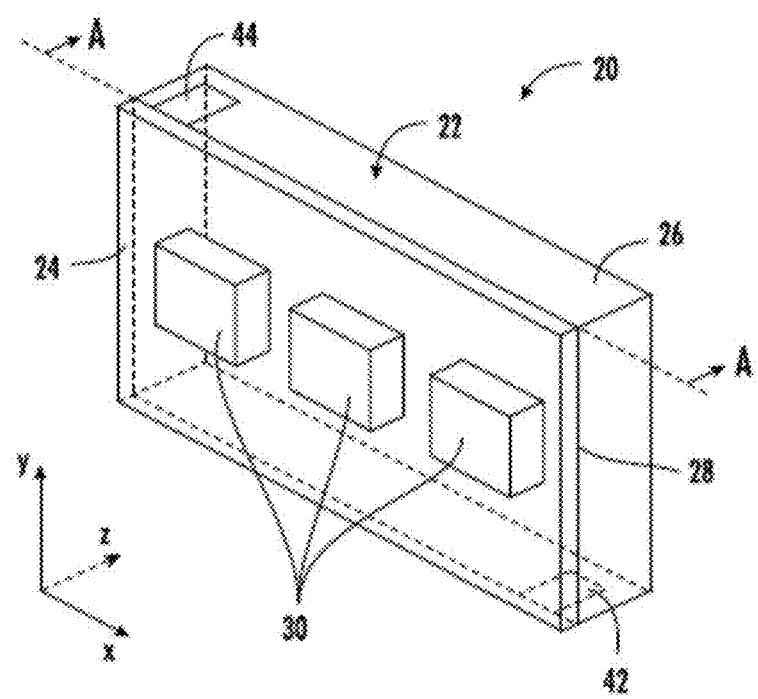
FIG. 1 is a schematic illustration of an exemplary heat exchanger and power electronic modules mounted thereto according to embodiment.

With reference now to FIG. 1, a schematic illustration of an example of a heat exchanger 20 is illustrated according to an embodiment. As shown, the heat exchanger 20 includes a housing 22 formed from a heat conductive material, such as a metal material. For example, the housing 22 may be formed from any suitable metal, e.g., aluminum, aluminum alloy, copper, copper alloy, or the like. In the illustrated, non-limiting embodiment, the housing 22 is formed from a plurality of housing portions, such as a first housing portion 24, and a second housing portion 26, joined along corresponding mating surfaces to form a seam 28 therebetween. In such embodiments, the first and second housing portions 24, 26 can abut one another along a side and can be joined using any suitable means such as brazing, welding, clamping, compressing, bolting, and the like. Although two housing portions 24, 26 are illustrated in the exemplary embodiments, it should be understood that a housing 22 formed from any number of housing portions including a single housing portion, or more than two housing portions for example, are within the scope of the disclosure.

The mating surfaces of the first and second housing portions 24, 26 may be configured to correspond to one another, e.g., to fit together to seal a fluid circuit therebetween (the fluid circuit to be described in more detail below). In an embodiment, the mating surfaces of the first and second housing portions 24, 26 include precision surfaces formed from a process having highly accurate and precise dimensional control, such as through computer numerical control (CNC) machining process and/or net shape, or near net shape manufacturing process. Optionally a sealing material can be disposed between the first and second housing portions 24, 26 to aide in preventing leakage from the fluid circuit.

As shown in FIG. 1, the first and second housing portions 24, 26 can have different thicknesses, measured along the z-axis. In the illustrated, non-limiting embodiment, a thickness of the first housing portion 24 is greater than a thickness of the second housing portion. However, embodiments where the first housing portion 24 and the second housing portion 26 are equal in thickness, or alternatively, where a thickness of the second housing portion 26 is greater than a thickness of the first housing portion 24 are also within the scope of the disclosure. In an embodiment, each of the first housing portion 24 and the second housing portion 26 is formed as a substantially solid plate. However, embodiments where one or more of the housing portions 24, 26 has another configuration are also contemplated herein.

Figure 2:
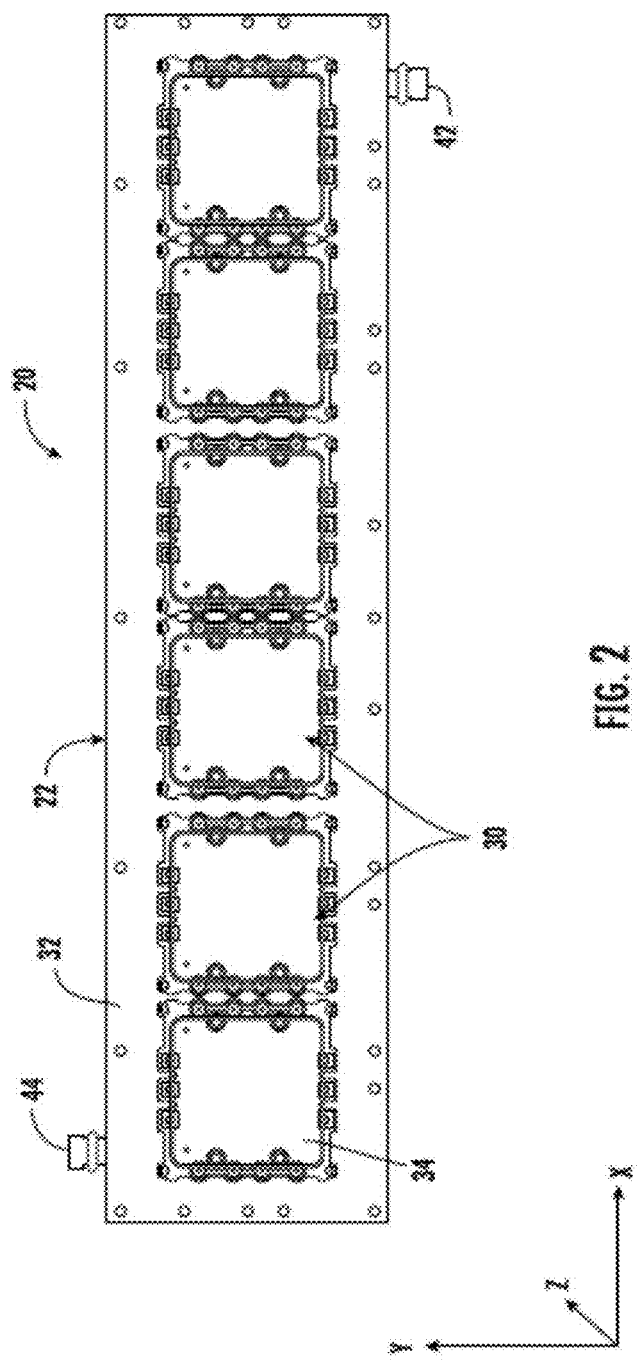
FIG. 2 is a front view of an exemplary heat exchanger having a plurality of power electronic mounted thereto according to an embodiment.

With continued reference to FIG. 1, and further reference to FIG. 2, a heat exchanger 20 as described herein can be used, such as in a vapor compression system for example, to cool at least one power electronic module 30. As described herein, a heat exchanger 20 having one or more power electronics modules 30 mounted thereon may be considered a heat exchanger assembly. The term "power electronic module" as used herein can refer to any electronic component which can provide a controlled output power by modulating and/or converting a supplied input power (e.g., a variable frequency drive, power rectifier, power converter, and the like). Such a power electronic module 30 can be used to control the speed of a compressor and/or the speed of the fan of a vapor compression system (e.g., chiller) based on various predetermined system conditions.

In an embodiment, the at least one power electronic module 30 is mounted directly to a surface 32 of at least one of the plurality of housing portions, such as first housing portion 24 for example. In the illustrated, non-limiting embodiment, a plurality of power electronics modules 30 are mounted to a vertically oriented surface 32 (e.g., vertical plane) of the housing 22. However, embodiments where one or more power electronics modules 30 are mounted to a surface of a housing 22 having a non-vertical orientation, such as a horizontal surface for example, are also within the scope of the disclosure. The power electronic modules 30 may be mounted to the housing 22 of the heat exchanger 20 via one or more fasteners in such a way that facilitates the transfer of thermal energy away from the power electronics module 30.

The one or more power electronics modules 30 may include a printed circuit board 34 on which various other electrical components (not shown) are mounted (e.g., protection, signal processing, and filtering related components). The reliability and life of the one or more power electronic modules 30 can depend upon precluding such electrical components from operating at high temperatures and/or precluding their exposure to thermal shock. Because the internal components of the power electronics module can generate a large amount of heat, each of the power electronics modules 30 has a heat sink interface (not shown) which is designed for attachment to a heat sink, such as the heat exchanger 20. When the power electronics modules 30 are secured in thermal communication with the heat exchanger 20, the heat generated by the power electronics module 30 is at least partially removed through the heat sink interface to keep the power electronics module 30 cooled below its maximum allowable operating temperature (e.g., 150° C.).

Figure 3:
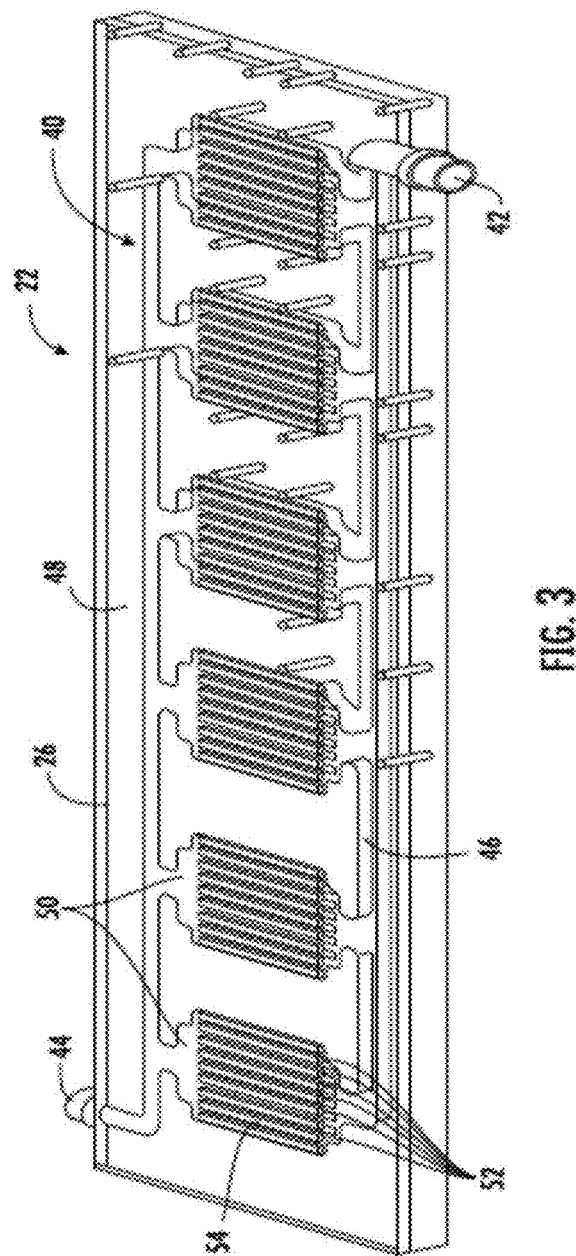
FIG. 3 is a perspective view of the cross-section A-A of the heat exchanger of FIG. 2 according to an embodiment.

With continued reference to FIGS. 1 and 2, and further reference to FIG. 3, the heat exchanger 20 includes a fluid circuit 40 formed between the first and second housing portions 24, 26. The fluid circuit 40 includes a fluid inlet 42 and fluid outlet 44 formed in the housing 22. In an embodiment, the fluid inlet 42 is disposed vertically below the fluid outlet 44 such that during operation of the heat exchanger 20, a flow direction of a cooling medium, such as refrigerant for example, through the fluid circuit opposes gravity. The fluid inlet 42 and the fluid outlet 44 can be any shape, such as in the depth dimension (e.g., in the z-x plane of the attached figure), including the shape of a circle, oval, triangular, square, rectangular, or any simple polygonal shape or portion thereof. Also, the fluid outlet 44 can have much larger diameter compared to the fluid inlet 42, thereby helping to reduce the pressure drop for the cooling medium mixture comprised of gas and liquid passing through the fluid outlet 44. Further, the perimeter of one or both of the fluid inlet 42 and the fluid outlet 44 can be formed by a recess in at least one or both of the housing portions 24, 26. The recess may extend to an edge of a respective housing portion, may be arranged centrally relative to a housing portion, or may overlap with the seam 28 defined between two adjacent housing portions 24, 26.

An example of the fluid circuit 40 is best illustrated in the cross-sectional view of the heat exchanger 20 shown in FIG. 3. In addition to the fluid inlet 42 and the fluid outlet 44, the fluid circuit includes a first or inlet manifold 46, a second or outlet manifold 48, and at least one fluid passage 50 connecting the first and second manifolds 46, 48. In an embodiment, the at least one fluid passage 50 includes a plurality of fluid passages 50. The fluid inlet 42 can be configured to connect a first cooling medium (e.g., refrigerant) source, such as a condenser of a vapor compression system for example, to the inlet manifold 46 using any suitable mechanical connection. Similarly, the fluid outlet 44 can be configured to connect a first heat transfer fluid sink, such as an evaporator of a vapor compression system for example, to the outlet manifold 48 using any suitable mechanical connection (e.g., compression coupling, brazing, welding, and the like).

One or more of the inlet manifold 46, the outlet manifold 48, and the at least one fluid passage 50 is formed as a recess in at least one of the first housing portion 24 and the second housing portion 26. In an embodiment, the inlet manifold 46, the outlet manifold 48, and the plurality of fluid passages 50 are formed as a plurality of connected recesses in at least one housing portion, such as the second housing portion 26 for example. Accordingly, the plurality of recesses form the fluid circuit 40 disposed between the first and second housing portions 24, 26 when the housing portions 24, 26 are joined. For example, a first housing portion 24 having a plurality of connected recesses can be joined to a flat, second housing portion 26 that does not have any recesses formed therein. In another embodiment, a first housing portion 24 and a second housing portion 26 can each have a plurality of connected recesses which mirror one another such that when the first and second housing portions 24, 26 are joined, the connected recesses form the fluid circuit. The plurality of connected recesses can have any shape in the depth dimension (e.g., as projected onto a z-y plane of the attached figures, into the plate), including semi-circular, semi-oval, triangular, square, rectangular, or any simple polygonal shape or portion thereof.

The mating surfaces of the first and second housing portions 24, 26 can substantially border the plurality of connected recesses. Optionally, the mating surfaces can include raised or recessed portions, or other engagement features to aid in alignment of the housing portions 24, 26 prior to joining.

The inlet manifold 46 and the outlet manifold 48 are oriented at a non-zero angle relative to the fluid inlet 42 and the fluid outlet 44, respectively. In the illustrated, non-limiting embodiment, the inlet manifold 46 and the outlet manifold 48 are oriented substantially horizontally. Although the inlet manifold 46 and the outlet manifold are illustrated as being arranged generally perpendicular to the fluid inlet 42 and fluid outlet 44, embodiments where the inlet manifold 46 and the outlet manifold 48 are arranged at another non-parallel configuration are also within the scope of the disclosure. Further, the one or more fluid passages connecting the inlet manifold 46 and the outlet manifold 48 may extend substantially perpendicular to the inlet and outlet manifolds 46, 48, such as in a vertical orientation as shown in FIG. 3, or alternatively, may be arranged at a non-zero angle relative to the direction of gravity.

In an embodiment, one or more fluid passages 50 of the fluid circuit 40 are configured to perform localized cooling at the areas of the heat exchanger 20 with the greatest heat flux, such as the areas where the power electronics modules are located (in contrast with cooling the entire heat exchanger 20). These one or more areas of the greatest heat flux may be referred to herein generally as at least one "area of heat flux." Accordingly, the at least one fluid passage 50 of the fluid circuit 40 is associated with a power electronics module 30 and in embodiments of the heat exchanger assembly having a plurality of power electronics modules 30, the fluid circuit 40 has a plurality of fluid passages 50, each fluid passage 50 being associated with a respective power electronics module 30. Each fluid passage 50 may be configured to remove heat from a specific power electronics module 30. In an embodiment, the at least one fluid passage 50 associated with a respective power electronics module 30 is physically located within the heat exchanger 20 in alignment with the power electronics module 30. For example, the at least one fluid passage 50 may be axially aligned with a respective power electronics module 30 relative to a major axis of the heat exchanger 20, such as the X axis (FIG. 1) for example. Accordingly, the power electronics module 30 is mounted in an overlapping relationship with a corresponding fluid passage 50. In such embodiments, the fluid circuit 40 may, but need not include a fluid passage 50 at an axial location of the heat exchanger 20 disposed between adjacent power electronic modules 30.

In an embodiment, a fluid passage 50 connecting the inlet manifold 46 and the outlet manifold 48 of the fluid circuit 40 includes a single channel 52 through which a cooling medium, such as refrigerant may flow. In other embodiments, at least one fluid passage 50 includes a plurality of channels 52 arranged in parallel. In embodiments where a fluid passage 50 includes a plurality of channels 52, the channels 52 may have similar, or alternatively, varying configurations. Because each fluid passage 50 is associated with the cooling of a respective power electronics module 30 mounted to the heat exchanger 20, it should be understood that in embodiments where the fluid circuit 40 includes a plurality of fluid passages 50, the configuration of each of the plurality of fluid passages 50 may be identical, or alternatively may vary, such as based on the size and cooling required by a corresponding power electronics module 30.

In embodiments where a fluid passage 50 includes a plurality of channels, the plurality of channels 52 may connect to the inlet manifold 46 via a single inlet interface and/or may connect to the outlet manifold 48 via a single outlet interface, as shown in FIG. 3. However, in an embodiment, at least one of the plurality of channels 52 may fluidly couple to one or both of the inlet manifold 46 and the outlet manifold at a separate location from the other channels 52 of the fluid passage 50.

The plurality of channels 52 that form a fluid passage 50 may be defined by a plurality of separate recesses formed into one or more portions of the housing 22. In another embodiment, the fluid passage 50 may be defined by a single recess formed in one or more portions of the housing 22 and a divider 54 or other component configured to fluidly separate the recess into a plurality of distinct channels 52 may be installed within the recess. In such embodiments, one or more dimensions, such as a measured along the X-axis or the Y-axis for example, may match a corresponding dimension of the power electronics module 30 at that location.

Figure 4:
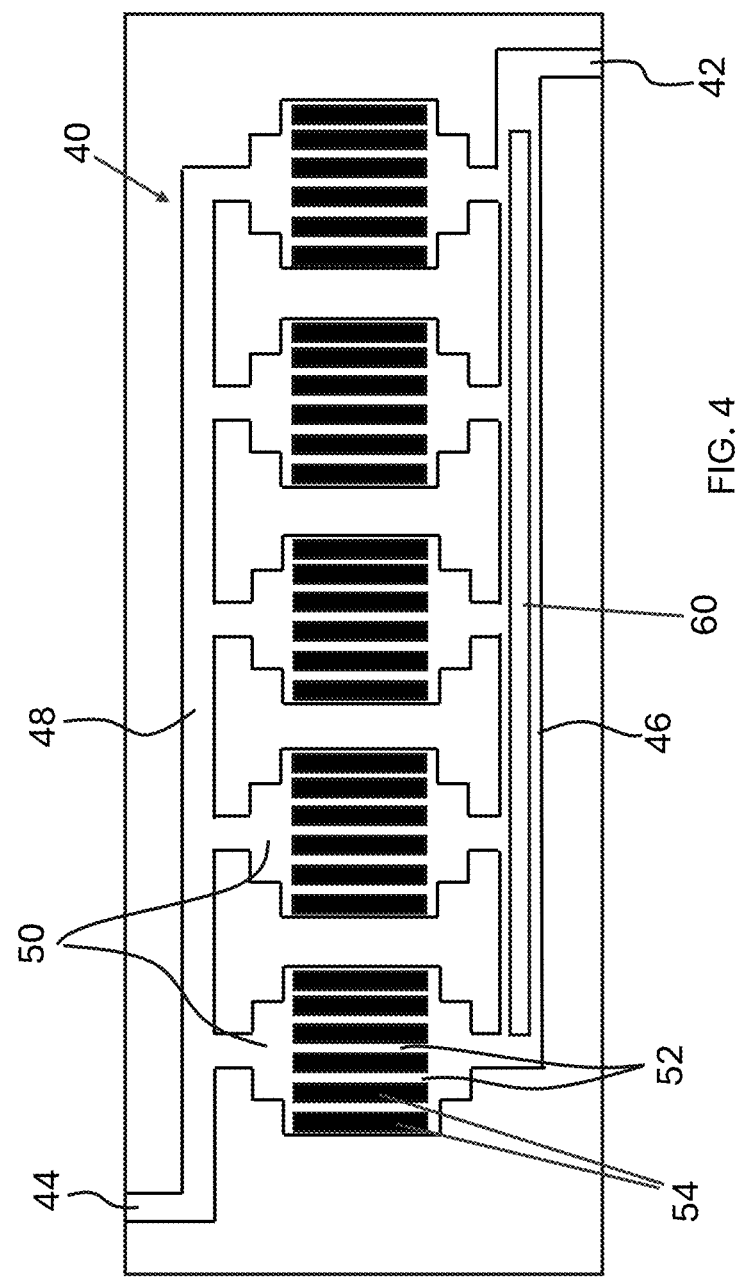
FIG. 4 is cross-sectional view of the heat exchanger of FIG. 2 according to another embodiment.

Further, in an embodiment, the inlet manifold 46 and the inlets to each of the fluid passages are configured such that the cooling medium is equally distributed between each of the plurality of fluid passages 50, and in some embodiments to each of the plurality of channels 52 within a fluid passage 50. To achieve this uniform distribution from the inlet manifold 46 to the plurality of fluid passages 50, the hydraulic diameter of the inlet manifold 46 may vary over the axial length of the inlet manifold. In another embodiment, an insert, such as a distributor 60 (see FIG. 4) type of device may be arranged within the inlet manifold.

Alternatively, or in addition to the above embodiments, the hydraulic diameter of the connection between the inlet manifold 46 and the inlet interface of each of the plurality of fluid passages 50 may vary based on the position of the fluid passage relative to axis of the inlet manifold 46. For example, the hydraulic diameter may be greatest at the inlet interface at the centermost fluid passage 50, or alternatively, at the two centrally located fluid passages 50 (in embodiments having an even number of power electronics modules 30 and therefore fluid passages 50). Further, the hydraulic diameter of the inlet end of the outermost fluid passages 50 may be about 0.25 or 0.3 of the maximum hydraulic diameter of the inlet end of the central fluid passage 50, and for each fluid passage 50 disposed between an outermost fluid passage 50 and the central fluid passage 50, the hydraulic diameter of the inlet end will gradually increase towards the central fluid passage 50.

Furthermore, the configuration of the fluid passages 50 may be substantially symmetrical relative to a central fluid passage 50 or a plane defined between two central fluid passages 50. For example, in embodiments having six fluid passages as shown, the ratio of the hydraulic diameter to the maximum hydraulic diameter at the inlets associated with the two outermost fluid passages is about 0.3, the ratio at the two centrally located fluid passages is 1 and the ratio at the fluid passages 50 between each outermost and each central fluid passage 50 is about 0.6. However, it should be understood that any suitable ratios are within the scope of the disclosure.

For efficient and balanced distribution of the cooling medium, the pressure drop across channels the inlet manifold 46 and the outlet manifold 48 shall be significantly lower, such as two to five times lower than the pressure drop across the fluid passages 50. In an embodiment, the configuration of the inlet manifold 46 and/or the plurality of inlet interfaces between the fluid passages 50 and the inlet manifold 46 is selected such that the pressure drop within the inlet manifold 46 is significantly smaller than the pressure drop across the fluid passages 50. In an embodiment, the pressure drop across the fluid passages 50 is at least five times, and in some embodiments between about five to about ten times greater than the pressure drop of the cooling medium as it passes through the inlet manifold 46. In such embodiments, the hydraulic diameter of the inlet end and outlet end of the fluid passage is less than a central portion of the fluid passage 50.

A heat exchanger having a fluid circuit 40 designed to perform balanced and localized cooling at the areas of the heat exchanger 20 that have the greatest heat flux will maximize the heat transfer from the power electronics modules 30 to the cooling medium, thereby avoiding hot pockets and extending the life of the electronic components within the power electronics modules 30.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A heat exchanger assembly comprising:
a housing having at least one area of heat flux;
a fluid circuit arranged within an interior of the housing, the fluid circuit having an inlet manifold, an outlet manifold, and at least one fluid passage connecting the inlet manifold and the outlet manifold, the at least one fluid passage being positioned relative to the housing to perform localized cooling of the housing at the at least one area of heat flux; and
a cooling medium circulating through the fluid circuit;
wherein the at least one fluid passage includes a plurality of fluid passages, each of the plurality of fluid passages includes a plurality of fluid channels arranged in parallel, the plurality of fluid channels being formed as a plurality of recesses in the housing.

2. The heat exchanger assembly of claim 1, further comprising at least one power electronics module mounted to the housing, the at least one area of heat flux being formed at the at least one power electronics module.

3. The heat exchanger assembly of claim 2, wherein the at least one power electronics module is mounted in a vertical plane.

4. The heat exchanger assembly of claim 2, wherein the at least one fluid passage is axially aligned with the at least one power electronics module relative to the housing.

5. The heat exchanger assembly of claim 4, wherein the at least one power electronics module is in an overlapping relationship with the at least one fluid passage.

6. The heat exchanger assembly of claim 4, wherein at least one of a size and shape of the at least one fluid passage is complementary to the at least one power electronics module.

7. The heat exchanger assembly of claim 1, wherein the at least one fluid passage comprises:
a single recess formed in the housing; and a divider arranged within the single recess, the divider forming the plurality of channels within the single recess.

8. The heat exchanger assembly of claim 1, wherein the plurality of channels are coupled to the inlet manifold via an inlet interface and the plurality of channels are coupled to the outlet manifold via an outlet interface.

9. The heat exchanger assembly of claim 2, wherein the at least one power electronics module includes a plurality of power electronics modules and the at least one area of heat flux includes a plurality of areas of heat flux, each of the plurality of areas of heat flux being formed at a respective power electronic module of the plurality of power electronics modules.

10. The heat exchanger assembly of claim 9, wherein the at least one fluid passage further comprises a plurality of fluid passages and the inlet manifold is configured such that the cooling medium is equally distributed to each of the plurality of fluid passages.

11. The heat exchanger assembly of claim 10, wherein a hydraulic diameter of the inlet manifold varies over a length of the inlet manifold.

12. The heat exchanger assembly of claim 11, further comprising a distributor arranged within the inlet manifold.

13. The heat exchanger assembly of claim 10, wherein the plurality of fluid passages is connected to the inlet manifold via a plurality of inlet interfaces, and a hydraulic diameter of a connection between each of the plurality of inlet interfaces and the inlet manifold varies over a length of the inlet manifold.

14. The heat exchanger assembly of claim 10, wherein a pressure drop across the plurality of fluid passages is at least five times greater than a pressure drop within the inlet manifold.

15. The heat exchanger assembly of claim 1, wherein the fluid circuit further comprises a fluid inlet operably coupled to the inlet manifold and a fluid outlet operably coupled to the outlet manifold, the fluid inlet being disposed below the fluid outlet such that during operation a flow direction of the cooling medium through the inlet manifold and the outlet manifold opposes gravity.

16. The heat exchanger assembly of claim 1, wherein the housing further comprises a first housing portion and a second housing portion joined along corresponding mating surfaces.

17. The heat exchanger assembly of claim 16, wherein at least one of the first housing portion and the second housing portion is a plate.

18. The heat exchanger assembly of claim 10, wherein a hydraulic diameter of a connection between each of the plurality of inlet interfaces and the inlet manifold is greatest at a centermost fluid passage.

\* \* \* \* \*